(12) United States Patent
Lim et al.

(10) Patent No.: US 10,312,445 B2
(45) Date of Patent: Jun. 4, 2019

(54) POLYMER AND ORGANIC ELECTRONIC ELEMENT COMPRISING SAME

(71) Applicant: LG CHEM, LTD., Seoul (KR)

(72) Inventors: Bogyu Lim, Daejeon (KR); Jaechol Lee, Daejeon (KR); Doowhan Choi, Daejeon (KR); Sungkyoung Kang, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/562,116

(22) PCT Filed: May 24, 2016

(86) PCT No.: PCT/KR2016/005478
§ 371 (c)(1),
(2) Date: Sep. 27, 2017

(87) PCT Pub. No.: WO2016/195305
PCT Pub. Date: Dec. 8, 2016

(65) Prior Publication Data
US 2018/0083195 A1  Mar. 22, 2018

(30) Foreign Application Priority Data

Jun. 3, 2015 (KR) .................. 10-2015-0078782
May 18, 2016 (KR) .................. 10-2016-0060910

(51) Int. Cl.
*C08G 61/12* (2006.01)
*H01L 51/00* (2006.01)
(Continued)

(52) U.S. Cl.
CPC ........ *H01L 51/0036* (2013.01); *C08G 61/123* (2013.01); *C08G 61/124* (2013.01); *C08G 61/126* (2013.01); *H01L 51/0043* (2013.01); *C08G 2261/124* (2013.01); *C08G 2261/146* (2013.01); *C08G 2261/149* (2013.01); *C08G 2261/1412* (2013.01); *C08G 2261/18* (2013.01); *C08G 2261/228* (2013.01); *C08G 2261/3223* (2013.01); *C08G 2261/3243* (2013.01); *C08G 2261/3246* (2013.01); *C08G 2261/344* (2013.01); *C08G 2261/364* (2013.01); *C08G 2261/51* (2013.01); *C08G 2261/91* (2013.01); *C08G 2261/92* (2013.01);
(Continued)

(58) Field of Classification Search
CPC ...................................................... C08G 61/12
USPC ......................................................... 528/377
See application file for complete search history.

(56) References Cited

U.S. PATENT DOCUMENTS 9,184,392 B2  11/2015 Kim et al.

FOREIGN PATENT DOCUMENTS

CN  103833991  6/2014
CN  104558535  4/2015
(Continued)

OTHER PUBLICATIONS

C.W.Tang, "Two layer organic photovoltaic cell", Applied Physics. Letters, vol. 48, pp. 183-185, 1986.
(Continued)

*Primary Examiner* — Duc Truong
(74) *Attorney, Agent, or Firm* — Myers Bigel, P.A.

(57) ABSTRACT

The present specification relates to a polymer, which comprises an electron acceptor functional group on a side chain and is represented by chemical formula 1 below, and to an organic electronic element comprising the same.

12 Claims, 8 Drawing Sheets

(51) Int. Cl.
    *H01L 51/42*    (2006.01)
    *H01L 51/52*    (2006.01)
    *H01L 51/05*    (2006.01)

(52) U.S. Cl.
    CPC ...... *C08G 2261/95* (2013.01); *H01L 51/0558* (2013.01); *H01L 51/42* (2013.01); *H01L 51/4253* (2013.01); *H01L 2251/552* (2013.01); *Y02E 10/549* (2013.01)

(56) References Cited

FOREIGN PATENT DOCUMENTS

| | | |
|---|---|---|
| JP | 20046782 | 1/2004 |
| KR | 10-2004-0055236 A | 6/2004 |
| KR | 10-2013-0090821 A | 8/2013 |
| WO | 2010088419 | 8/2010 |
| WO | 2015-013747 A1 | 2/2015 |

OTHER PUBLICATIONS

Nallan Chakaravarthi et al., "Synthesis, Characterization, and Photovoltaic Properties of 4,8-Dithienylbenzo[1,2-b:4,5-oldithiophene-Based Donor-Acceptor Polymers with New Polymerization and 2D Conjugation Extension Pathways: A Potential Donor Building Block for High Performance and Stable Inverted Organic Solar Cells", Macromolecules, 2005, vol. 48, pp. 2454-2465.
Mudan Yu et al., "Narrow-band Gap Benzodipyrrolidone (BDPD) based Donor Conjugated Polymer. A Theoretical Investigation", Computational and Theretical Chemistry, vol. 1055, pp. 88-93.
Extended European Search Report corresponding to European Patent Application No. 16803660.6 dated Dec. 7, 2018. (8 pages).

[Figure 1]
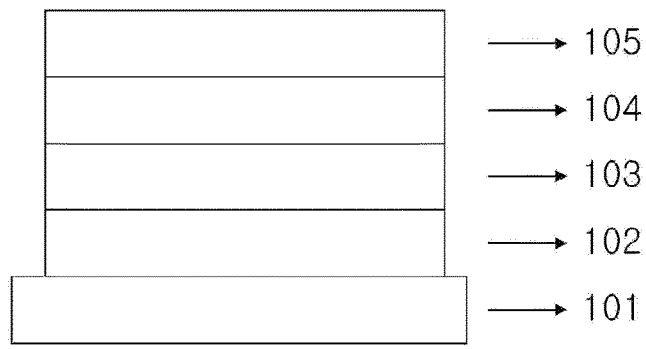
[Figure 2]
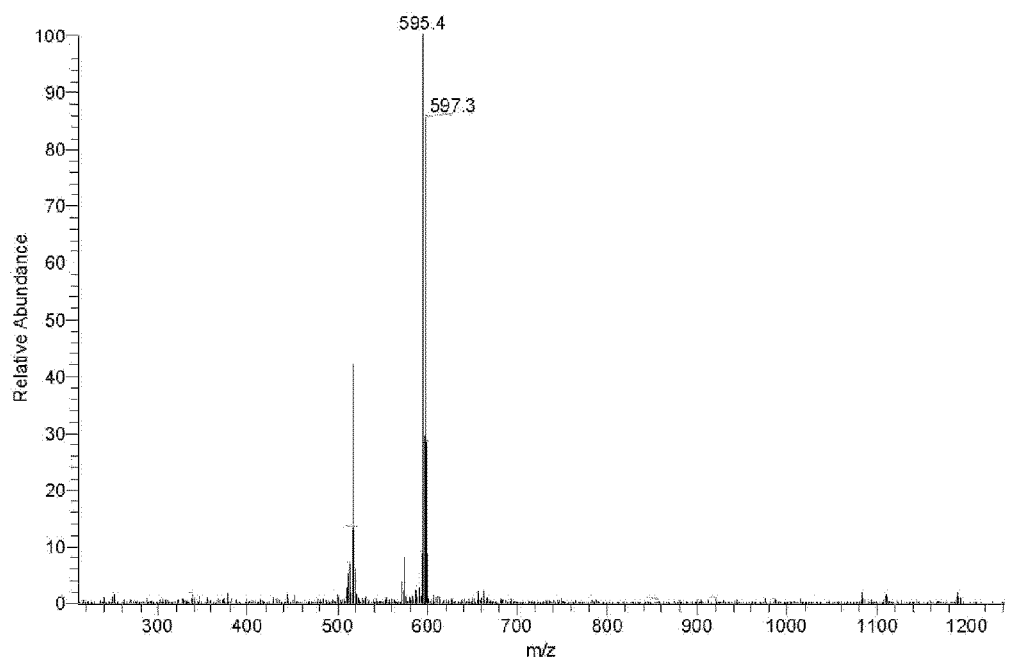

[Figure 3]
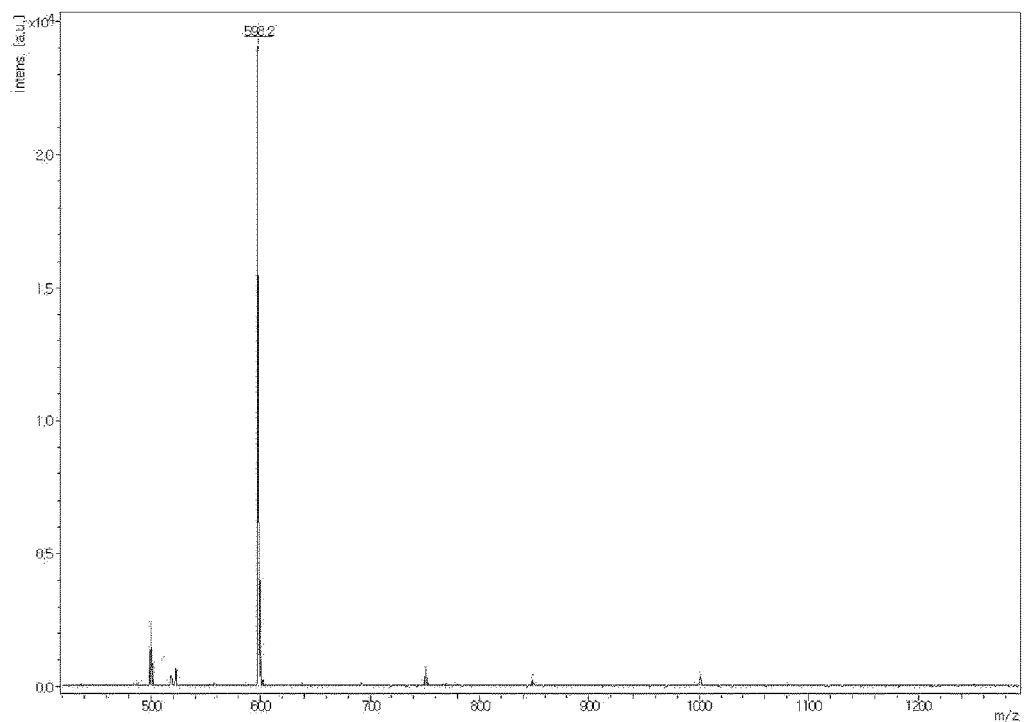

[Figure 4]
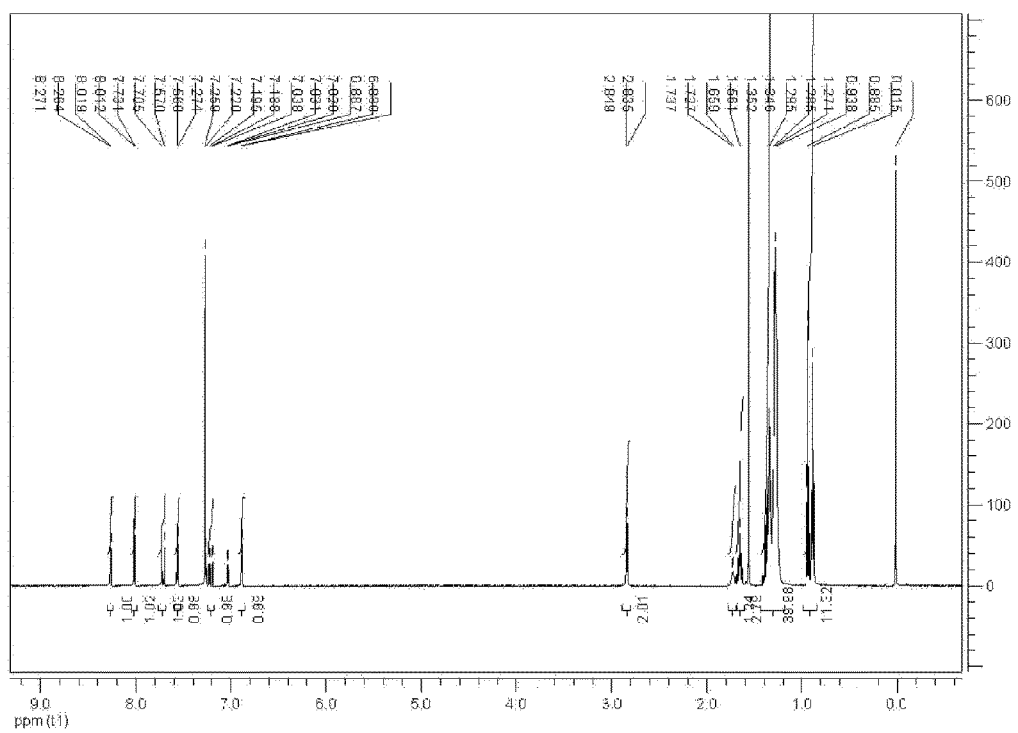

[Figure 5]
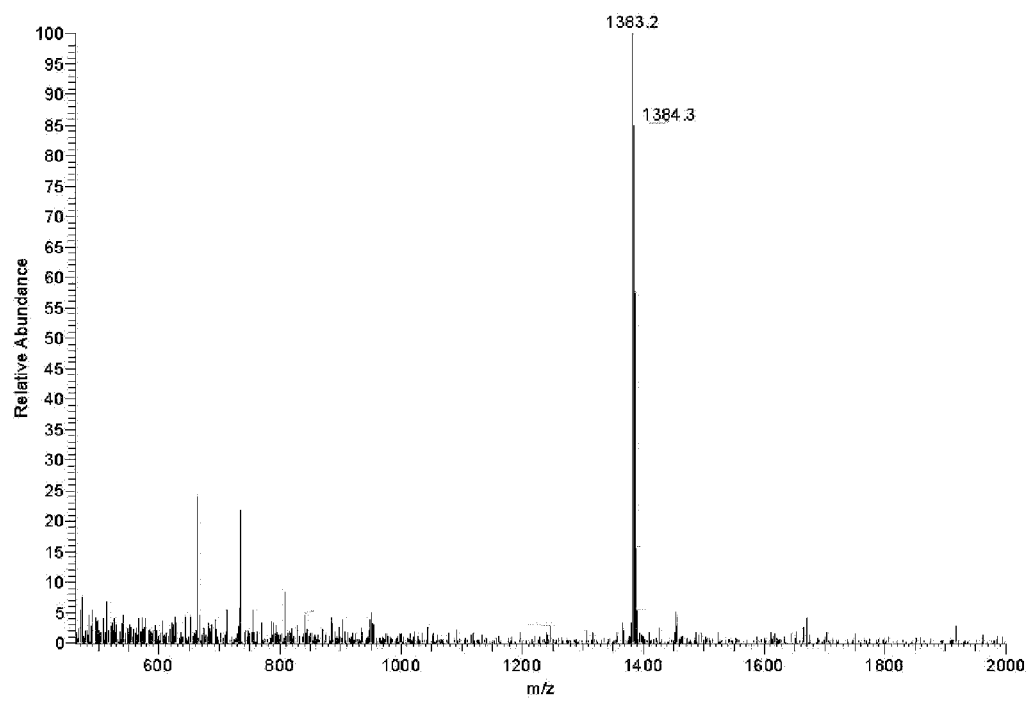

[Figure 6]
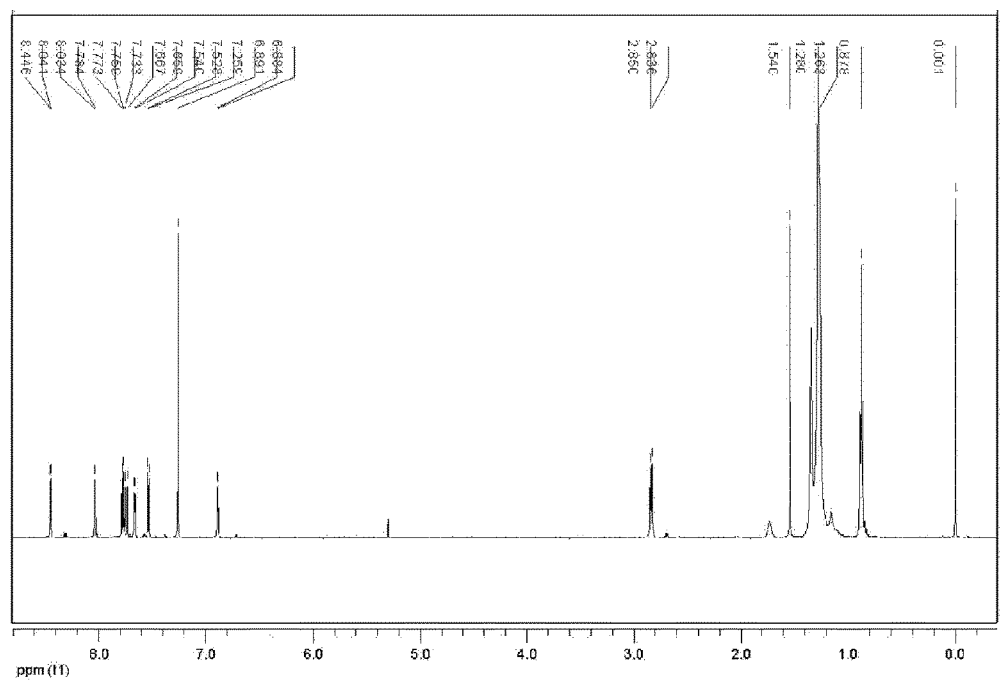

[Figure 7]
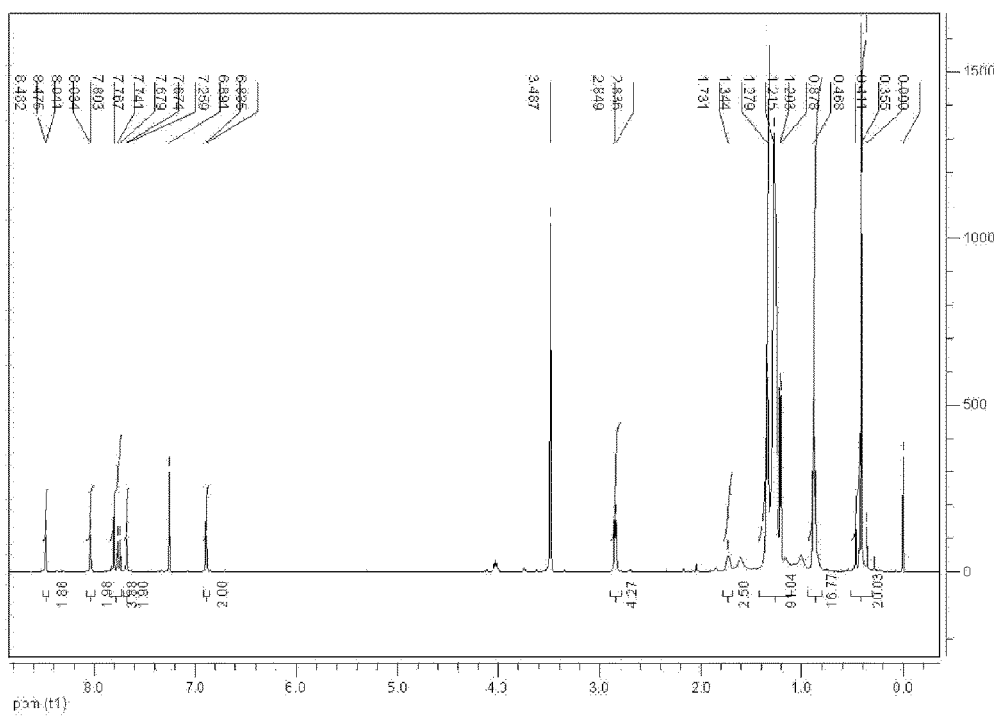

[Figure 8]
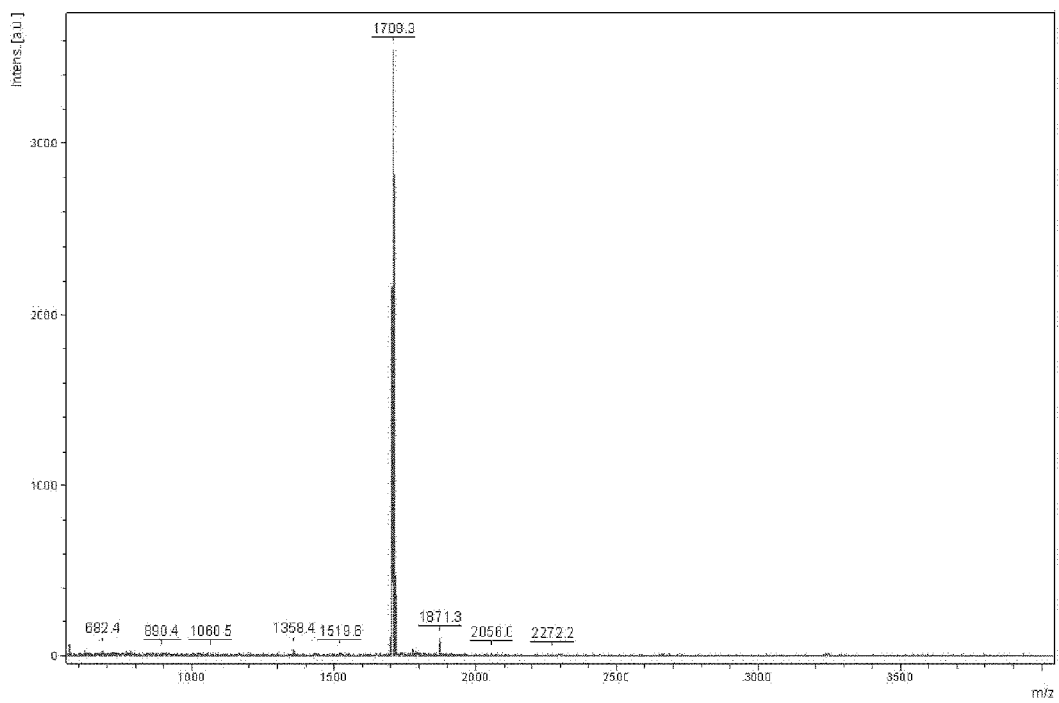

[Figure 9]
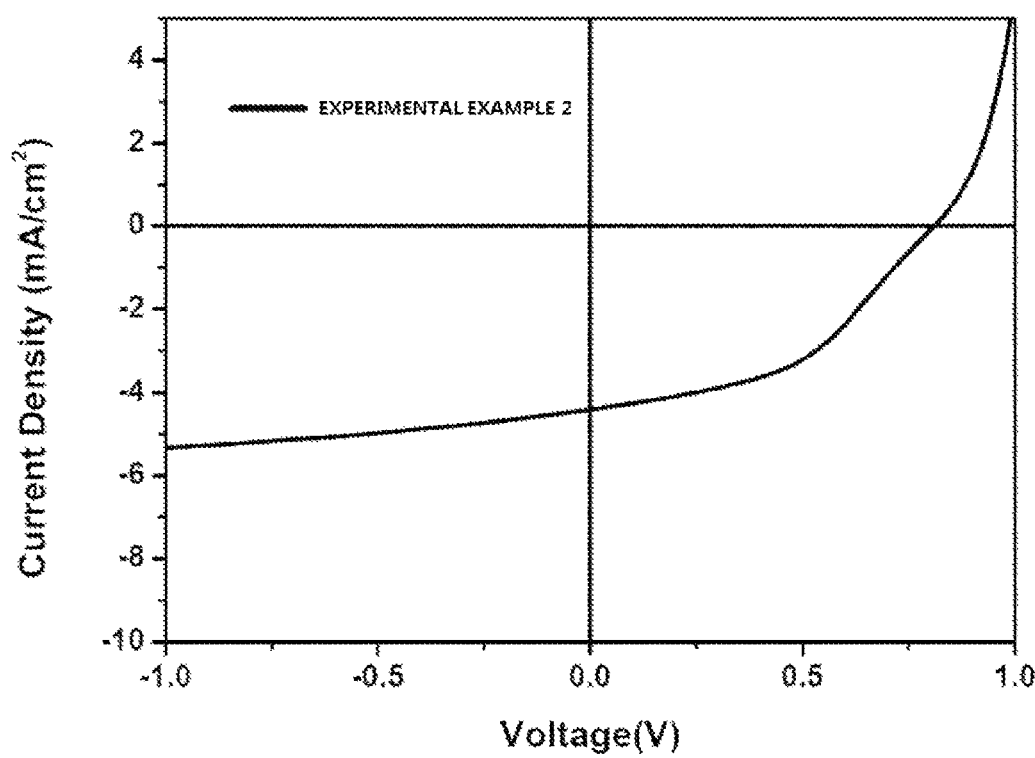

POLYMER AND ORGANIC ELECTRONIC ELEMENT COMPRISING SAME

TECHNICAL FIELD

This application is a National Stage Entry of International Application No. PCT/KR2016/005478 filed on May 24, 2016, and claims the benefit of Korean Application No. 10-2015-0078782, filed on Jun. 2, 2015, and Korean Application No. 10-2016-0060910, filed on May 18, 2016, all of which are hereby incorporated by reference in their entirety for all purposes as if fully set forth herein.

The present specification relates to a polymer and an organic electronic device including the same.

BACKGROUND ART

An organic electronic device means a device that requires exchanging of electric charges between electrodes using holes and/or electrons and organic materials. The organic electronic device may be largely divided into the following two devices depending on the operation principle. First, the organic electronic device is an electric device in which an exciton is formed in an organic material layer by a photon that flows from an external light source to the device, the exciton is dissociated into electrons and holes, and the electrons and the holes are each transferred to different electrodes and used as a current source (voltage source). Second, the organic electronic device is an electronic device in which holes and/or electrons are injected into an organic material semiconductor, which forms an interface with an electrode, by applying voltage or current to two or more electrodes, and the device is operated by the injected electrons and holes.

Examples of an organic electronic device include an organic light emitting device, an organic solar cell, an organic transistor, and the like, and these all need a hole injection or transporting material, an electron injection or transporting material, or a light emitting material for driving the device. Hereinafter, an organic solar cell will be mainly described in detail, but in the organic electronic devices, a hole injection or transporting material, an electron injection or transporting material, or a light emitting material is operated under similar principles.

A possibility of an organic solar cell was first presented in the 1970s, but the efficiency thereof was so low that the organic solar cell had no practical use.

However, C. W. Tang of Eastman Kodak showed the possibility of commercialization as various solar cells with a double layer structure using copper phthalocyanine (CuPc) and perylene tetracarboxylic acid derivatives in 1986, and then interests in organic solar cells and related researches have rapidly increased, thereby bringing about a lot of advancement.

Since then, organic solar cells have made the breakthrough in terms of efficiency of the organic solar cell as the concept of bulk heterojunction (BHJ) was introduced by Yu et al. in 1995, and fullerene derivatives of which the solubility is improved such as PCBM have been developed as an n-type semiconductor material.

Since then, studies have been continuously conducted in order to increase the efficiency of an organic solar cell.

DETAILED DESCRIPTION OF THE INVENTION

Technical Problem

An object of the present specification is to provide a polymer and an organic electronic device including the same.

Technical Solution

The present specification provides a polymer including a unit represented by the following Chemical Formula 1.

[Chemical Formula 1]

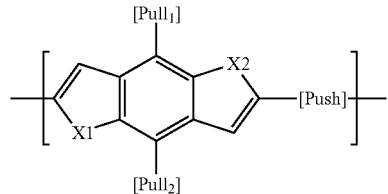

In Chemical Formula 1,

X1 and X2 are the same as or different from each other, and are each independently CRR', NR, O, SiRR', PR, S, GeRR', Se, or Te, R and R' are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group,

[Push] is a structure in which one or two or more among the following structures are bonded,

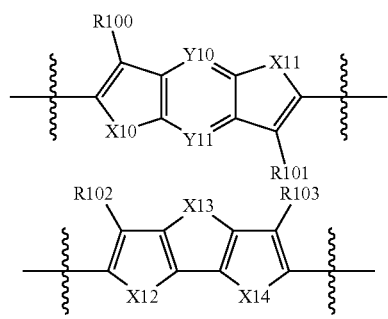

-continued

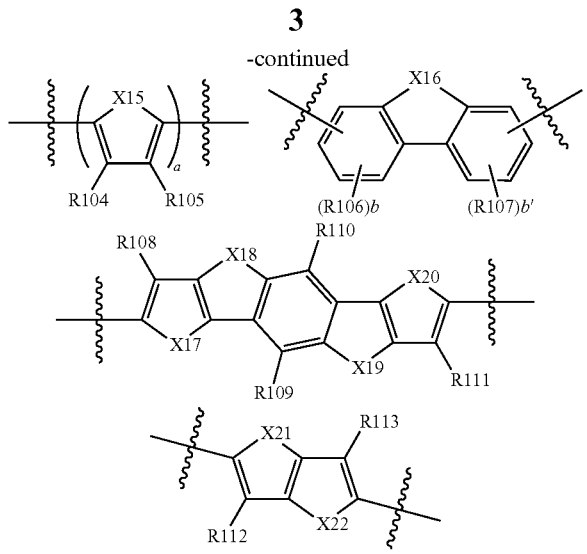

in the structures, a is an integer from 1 to 4, b and b' are each an integer from 1 to 3, when a, b, and b' are each 2 or more, two or more structures in the parenthesis are the same as or different from each other, X10 to X22 are the same as or different from each other, and are each independently CRaRb, NRa, O, SiRaRb, PRa, S, GeRaRb, Se, or Te, Y10 and Y11 are the same as or different from each other, and are each independently CRc, N, SiRc, P, or GeRc, Ra, Rb, Rc, and R100 to R113 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group,

[Pull$_1$] and [Pull$_2$] are a group that acts as an electron acceptor, are the same as or different from each other, and are each independently represented by the following Chemical Formula 2 or the following Chemical Formula 3,

[Chemical Formula 2]

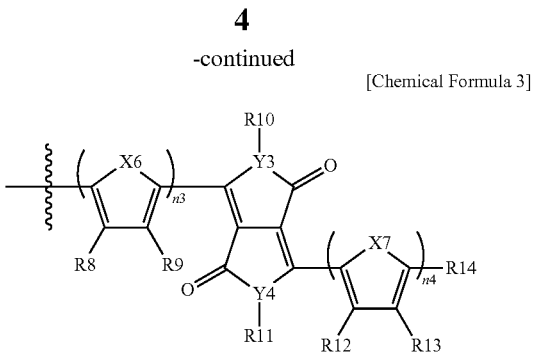

[Chemical Formula 3]

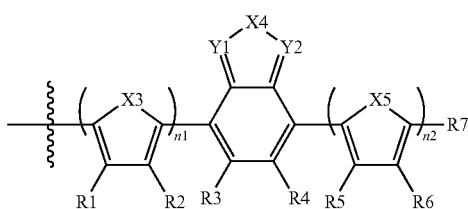

in Chemical Formulae 2 and 3,

X3 to X7 are the same as or different from each other, and are each independently CR15R16, NR15, O, SiR15R16, PR15, S, GeR15R16, Se, or Te, Y1 to Y4 are the same as or different from each other, and are each independently CR17, N, SiR17, P, or GeR17, n1 is an integer of 0 or 1, n2 to n4 are each an integer from 0 to 3, when n2 to n4 are each an integer of 2 or more, two or more structures in the parenthesis are the same as or different from each other, and R1 to R17 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group.

Further, the present specification provides an organic electronic device including: a first electrode; a second electrode; and an organic material layer having one or more layers disposed between the first electrode and the second electrode, wherein one or more layers of the organic material layer comprise the above-described polymer.

Advantageous Effects

A polymer according to an exemplary embodiment of the present specification includes an electron acceptor as a side chain, and as a result, electrons are localized in the side chain of the polymer. Accordingly, the dielectric constant may be increased.

Further, since the side chain of the polymer according to an exemplary embodiment of the present specification includes an electron acceptor and thus is easily brought into contact with an n-type material of a device, for example, PCMB, electrons may be easily transferred to the n-type material.

Accordingly, an organic electronic device including a fused ring derivative according to an exemplary embodiment of the present specification may exhibit excellent characteristics in terms of an increase in open voltage and short-circuit current and/or an enhancement in efficiency, and the like.

The fused ring derivative according to an exemplary embodiment of the present specification can be used either alone or in mixture with other materials in an organic electronic device, and may be expected to improve the efficiency, and improve the service life of the device by characteristics such as thermal stability of the compound.

BRIEF DESCRIPTION OF DRAWINGS

FIG. 1 is a view illustrating an organic solar cell according to an exemplary embodiment of the present specification.

FIG. 2 is a view illustrating an MS spectrum of Chemical Formula 1-A.

FIG. 3 is a view illustrating an MS spectrum of Chemical Formula 1-B.

FIG. 4 is a view illustrating NMR data of Chemical Formula 1-B.

FIG. 5 is a view illustrating an MS spectrum of Chemical Formula 1-C.

FIG. 6 is a view illustrating NMR data of Chemical Formula 1-C.

FIG. 7 is a view illustrating NMR data of Chemical Formula 1-D.

FIG. 8 is a view illustrating MS data of Chemical Formula 1-D.

FIG. 9 is a view illustrating current density according to voltage in an organic solar cell manufactured in Experimental Example 2.

101: Substrate
102: First electrode
103: Hole transporting layer
104: Photoactive layer
105: Second electrode

BEST MODE

Hereinafter, the present specification will be described in more detail.

The present specification provides a polymer including the unit represented by Chemical Formula 1.

In an exemplary embodiment of the present specification, the [Pull$_1$] and the [Pull$_2$] are each independently a group that acts as an electron acceptor, and the [Push] is a group that acts as an electron donor.

In this case, a main chain of a polymer according to an exemplary embodiment of the present specification is composed of a structure that acts as an electron donor, and a side chain of the polymer is composed of a structure that acts as an electron acceptor.

Charge carrier mobility within an organic material has the fastest mobility in the intramolecular direction, and a transfer of charge carriers in the n-n direction is dominant. Accordingly, in order to cause a fast transfer of holes and electrons, excitons need to be rapidly dissociated, and the recombination of electrons and holes is minimized only when holes and electrons need to move via each pathway, thereby expecting high efficiency.

In the related art, a p-type, that is, a polymer being an electron-donating material is provided so as to cause a low band gap due to an intramolecular charge transfer (ICT) by alternately or randomly combining an electron-rich electron-donating unit (push) and an electron-poor electron-withdrawing unit (pull). In this case, since an electron-donating unit and an electron-withdrawing unit are simultaneously present in a main chain of a polymer, electrons and holes co-exist in the main chain of the polymer, so that there is a concern in that the reduction in efficiency occurs.

Since the main chain of the polymer according to an exemplary embodiment of the present specification is composed of a structure which acts as an electron donor and the side chain of the polymer is composed of a structure which acts as an electron acceptor, electrons are relatively localized. Accordingly, it is possible to expect to increase a dielectric constant and to minimize a recombination of electrons and holes, and to expect high mobility of holes and electrons.

Further, the side chain of the polymer of the present specification is composed of an electron-withdrawing unit (pull), and thus is easily brought into contact with an n-type material, for example, an electron acceptor material such as PCBM, so that electrons may be easily transferred.

In an exemplary embodiment of the present specification, for the [Pull$_1$] and the [Pull$_2$], reduction is observed in the electrochemical measurement (cyclic voltammetry: CV).

In an exemplary embodiment of the present specification, X1 and X2 are S.

In an exemplary embodiment of the present specification, [Pull$_1$] and [Pull$_2$] are the same as or different from each other, and are each independently a heteroaryl group which acts as an electron acceptor.

In the present specification, the heteroaryl group may be monocyclic or polycyclic, and may be a group to which one or two or more heteroaryl groups are linked.

In an exemplary embodiment of the present specification, X3 is S.

In another exemplary embodiment, X4 is S.

In an exemplary embodiment of the present specification, X5 is S.

In an exemplary embodiment of the present specification, Y1 is N.

In an exemplary embodiment of the present specification, Y2 is N.

In one exemplary embodiment of the present specification, X6 is S.

In another exemplary embodiment, X7 is S.

In an exemplary embodiment of the present specification, Y3 is N.

In an exemplary embodiment of the present specification, Y4 is N.

In an exemplary embodiment of the present specification, the [Pull$_1$] and [Pull$_2$] represented by Chemical Formula 2 or Chemical Formula 3 are represented by the following Chemical Formula 2-1 or Chemical Formula 3-1.

[Chemical Formula 2-1]

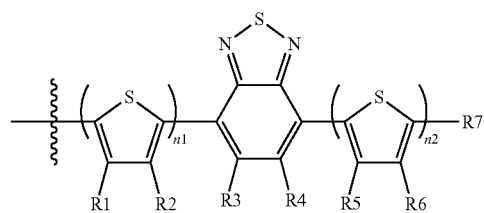

[Chemical Formula 3-1]

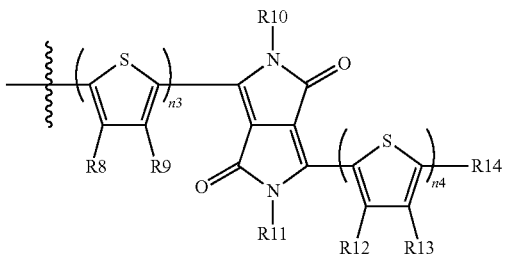

In Chemical Formulae 2-1 and 3-1, n1 to n4 and R1 to R14 are the same as those defined in Chemical Formula 2 and Chemical Formula 3.

In the chemical formulae, in the case where n1 is 0 or 1, the intramolecular charge transfer (ICT) between [Push] and [Pull$_1$] or [Push] and [Pull$_2$] occurs strongly, which is advantageous to absorb a long wavelength due to the small difference in band gap, as compared to the case where n1 is 2 or more.

Examples of the substituents will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or more substituents selected from the group consisting of deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted aryl group; and a substituted or unsubstituted heterocyclic group or being substituted with a substituent to which two or more substituents are linked among the substituents exemplified above, or having no substituent. For example, "the substituent to which two or more substituents are linked" may be a biphenyl group. That is, the biphenyl group may also be an aryl group, and may be interpreted as a substituent to which two phenyl groups are linked.

In the present specification, the number of carbon atoms of an imide group is not particularly limited, but is preferably 1 to 30. Specifically, the imide group may be a compound having the following structures, but is not limited thereto.

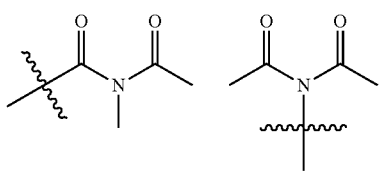

In the present specification, for an amide group, one or two nitrogen atoms of the amide group may be substituted with hydrogen, a straight, branched, or cyclic alkyl group having 1 to 30 carbon atoms, or an aryl group having 6 to 30 carbon atoms. Specifically, the amide group may be a compound having the following structural formulae, but is not limited thereto.

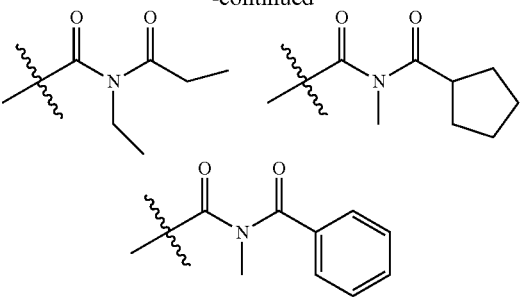

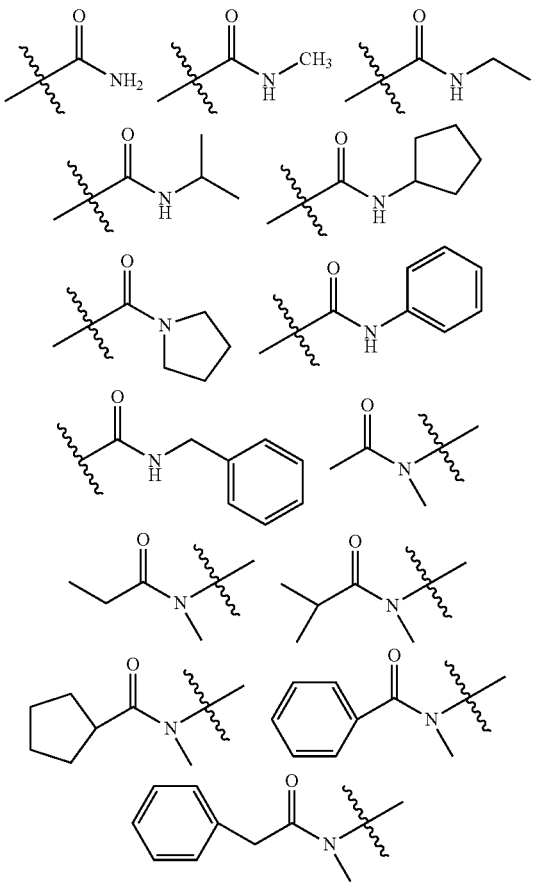

In the present specification, examples of a halogen group include fluorine, chlorine, bromine or iodine.

In the present specification, the alkyl group may be straight or branched, and the number of carbon atoms thereof is not particularly limited, but is preferably 1 to 50. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, a cycloalkyl group is not particularly limited, but the number of carbon atoms thereof is preferably 3 to 60, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight, branched, or cyclic. The number of carbon atoms of the alkoxy group is not particularly limited, but is preferably 1 to 20. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, the alkenyl group may be straight or branched, and the number of carbon atoms thereof is not particularly limited, but is preferably 2 to 40. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, when the aryl group is a monocyclic aryl group, the number of carbon atoms thereof is not particularly limited, but is preferably 6 to 25. Specific examples of the monocyclic aryl group include a phenyl group, a biphenyl group, a terphenyl group, and the like, but are not limited thereto.

In the present specification, when the aryl group is a polycyclic aryl group, the number of carbon atoms thereof is not particularly limited, but is preferably 10 to 24. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the fluorenyl group may be

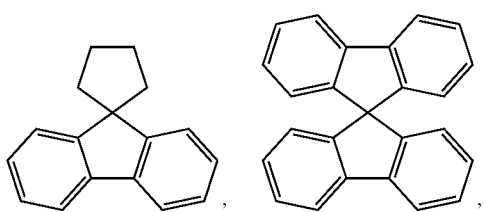

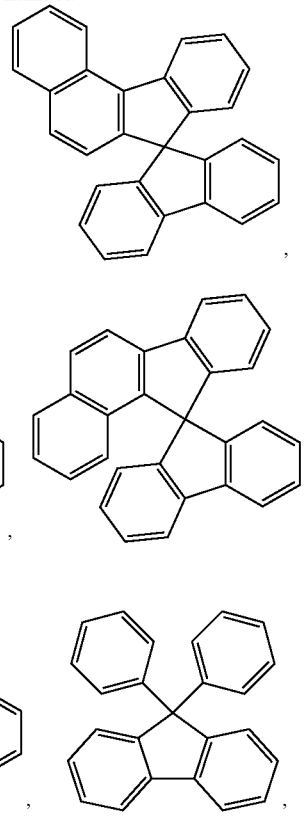

and the like. However, the fluorenyl group is not limited thereto.

In the present specification, a heterocyclic group includes one or more atoms other than carbon, that is, one or more heteroatoms, and specifically, the heteroatom may include one or more atoms selected from the group consisting of O, N, Si, Se, S, and the like. The number of carbon atoms of the heterocyclic group is not particularly limited, but is preferably 2 to 60. Examples of the heterocyclic group include a thiophene group, a furan group, a pyrrole group, an imidazole group, a thiazole group, an oxazole group, an oxadiazole group, a pyridyl group, a bipyridyl group, a pyrimidyl group, a triazine group, a triazole group, an acridyl group, a pyridazine group, a pyrazinyl group, a qinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the number of carbon atoms of an amine group is not particularly limited, but is preferably 1 to 30. An N atom of the amine group may be substituted with an aryl group, an alkyl group, an arylalkyl group, a heterocyclic group, and the like, and specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a phenylnaphthylamine group, a ditolylamine group, a phenyltolylamine group, a triphenylamine group, and the like, but are not limited thereto.

In the present specification, the aryl group in the aryloxy group, the arylthioxy group, and the arylsulfoxy group is the same as the above-described examples of the aryl group. Specifically, examples of the aryloxy group include phenoxy, p-tolyloxy, m-tolyloxy, 3,5-dimethyl-phenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, the alkyl group in the alkylthioxy group and the alkylsulfoxy group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include mesyl, an ethylsulfoxy group, a propylsulfoxy group, a butylsulfoxy group, and the like, but the examples are not limited thereto.

In an exemplary embodiment of the present specification, the polymer includes a unit represented by any one of the following Chemical Formulae 1-1 to 1-4.

[Chemical Formula 1-1]

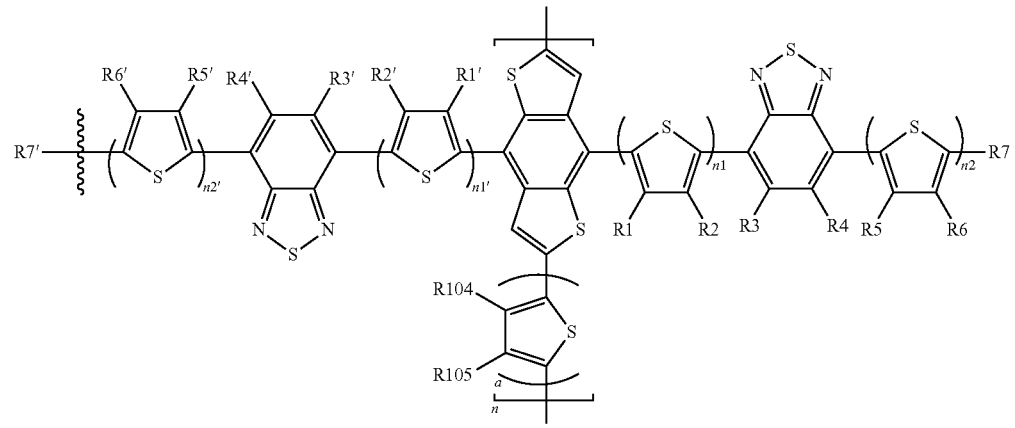

[Chemical Formula 1-2]

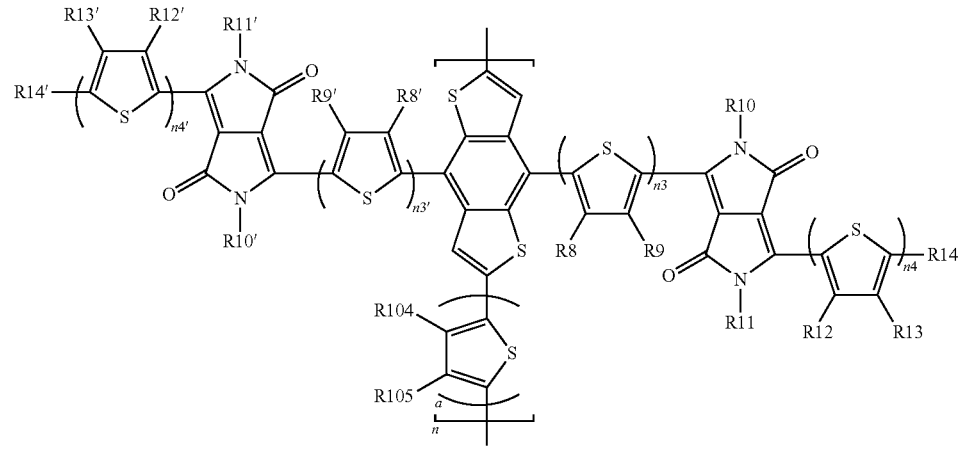

[Chemical Formula 1-3]

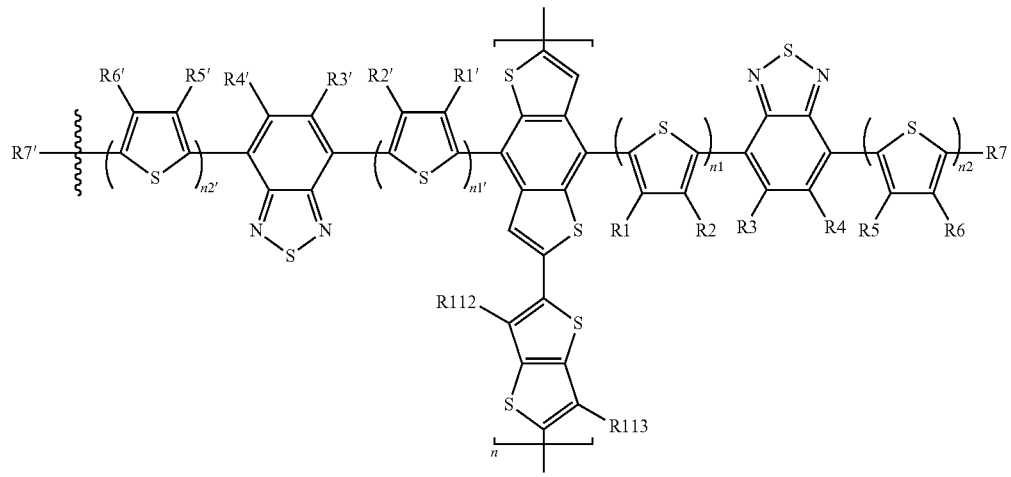

[Chemical Formula 1-4]

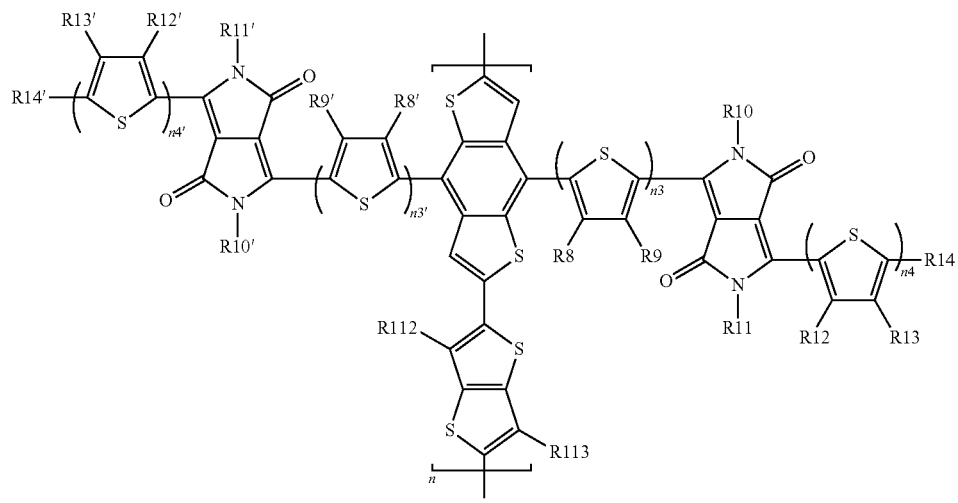

In Chemical Formulae 1-1 to 1-4, a is an integer from 1 to 4, n is a repeating number of the unit, and an integer from 1 to 1,000, n1 and n1' are an integer of 0 or 1, n2 to n4 and n2' to n4' are each an integer from 0 to 3, when a, n2 to n4, and n2' to n4' are each an integer of 2 or more, two or more structures in the parenthesis are the same as or different from each other, and R1 to R14, R1' to R14', R104, R105, R112, and R113 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group.

In an exemplary embodiment of the present specification, n1 and n1' are 1.

In another exemplary embodiment of the present specification, n1 and n1' are 0.

In still another exemplary embodiment, n2 and n2' are 1.

In an exemplary embodiment of the present specification, n3 and n3' are 1.

In another exemplary embodiment, n4 and n4' are 1.

In an exemplary embodiment of the present specification, R1 is hydrogen.

In another exemplary embodiment, R2 is hydrogen.

In an exemplary embodiment of the present specification, R3 and R4 are the same as or different from each other, and are each independently hydrogen or a halogen group.

In an exemplary embodiment of the present specification, R3 is hydrogen.

In another exemplary embodiment of the present specification, R3 is a halogen group.

In still another exemplary embodiment, R3 is fluorine.

In an exemplary embodiment of the present specification, R4 is hydrogen.

In another exemplary embodiment of the present specification, R4 is a halogen group.

In still another exemplary embodiment, R4 is fluorine.

In an exemplary embodiment of the present specification, R5 is hydrogen.

In another exemplary embodiment, R6 is hydrogen.

In an exemplary embodiment of the present specification, R7 is a substituted or unsubstituted alkyl group.

In an exemplary embodiment of the present specification, R7 is a substituted or unsubstituted alkyl group having 1 to 30 carbon atoms.

In another exemplary embodiment, R7 is a substituted or unsubstituted 2-octyldodecanyl group.

In still another exemplary embodiment, R7 is a 2-octyldodecanyl group.

In an exemplary embodiment of the present specification, a is 1.

In another exemplary embodiment of the present specification, a is 2.

In still another exemplary embodiment, a is 3.

In an exemplary embodiment of the present specification, the case where a is 2 or 3 is more preferred because excellent interdigitation with a side chain between a unit and a unit may be caused and a highly dense film may be manufactured by minimizing the rotation of the side chain to increase a phi-phi packing between the units.

In an exemplary embodiment of the present specification, the unit represented by Chemical Formula 1 may be represented by the following unit, but is not limited thereto.

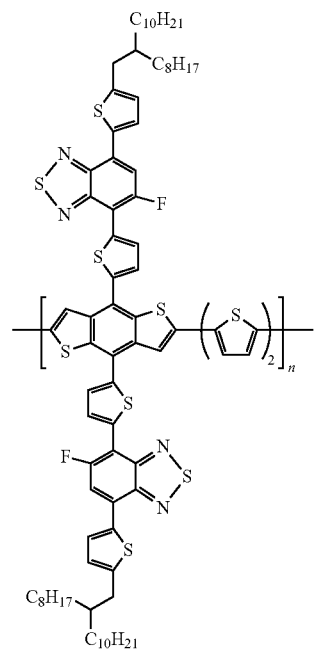

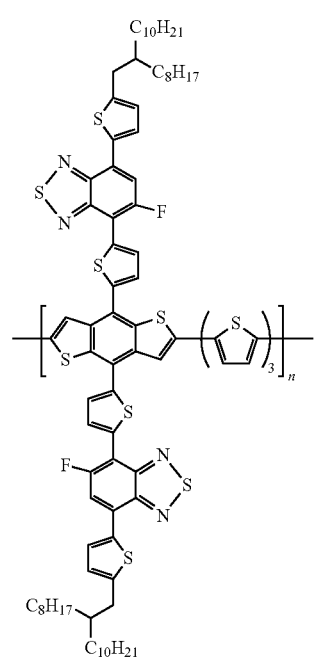

-continued

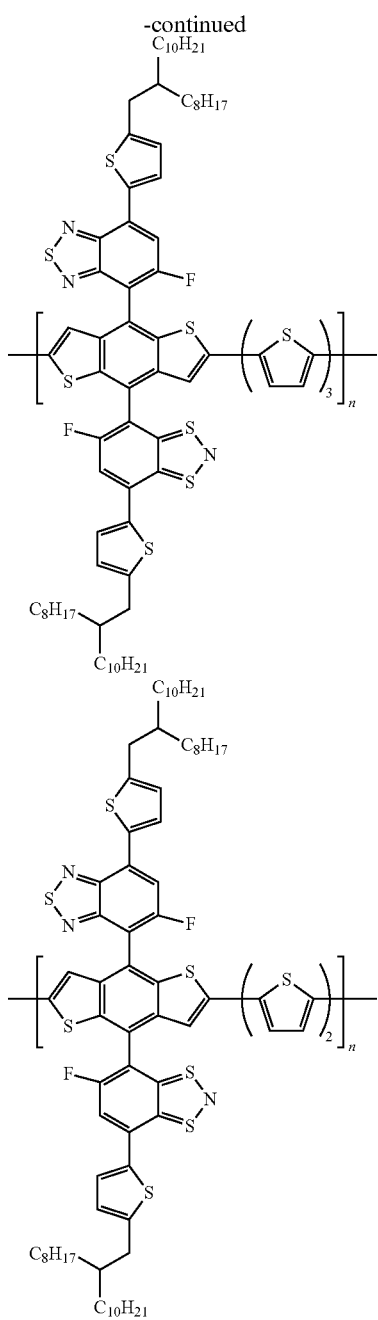

According to an exemplary embodiment of the present specification, the polymer has a number average molecular weight of preferably 5,000 g/mol to 1,000,000 g/mol.

According to an exemplary embodiment of the present specification, the polymer may have a molecular weight distribution of 1 to 10. Preferably, the polymer has a molecular weight distribution of 1 to 3.

The lower the molecular weight distribution is and the higher the number average molecular weight becomes, the better electrical characteristics and mechanical characteristics become.

Further, it is preferred that the polymer has a number average molecular weight of 100,000 or less so that the polymer has predetermined or more solubility, and thus, a solution application method is advantageously applied.

The polymer according to the present specification may be prepared by a multi-step chemical reaction. Monomers are prepared through an alkylation reaction, a Grignard reaction, a Suzuki coupling reaction, a Stille coupling reaction, and the like, and then final polymers may be prepared through a carbon-carbon coupling reaction such as a Stille coupling reaction. When a substituent to be introduced is a boronic acid or boronic ester compound, the polymer may be prepared through a Suzuki coupling reaction, and when a substituent to be introduced is a tributyltin or trimethyltin compound, the polymer may be prepared through a Stille coupling reaction, but the method is not limited thereto.

The present specification provides an organic electronic device including: a first electrode; a second electrode; and an organic material layer having one or more layers disposed between the first electrode and the second electrode, in which one or more layers of the organic material layer include the above-described polymer.

A case where one member is disposed "on" another member in the present specification includes not only a case where the one member is brought into contact with another member, but also a case where still another member is present between the two members.

A case where one part "includes" one constituent element in the present specification, unless otherwise specifically described, does not mean that another constituent element is excluded, but means that another constituent element may be further included.

In an exemplary embodiment of the present specification, the organic electronic device is selected from the group consisting of an organic light emitting device; an organic solar cell; and an organic transistor.

In an exemplary embodiment of the present specification, the organic electronic device may be an organic light emitting device.

An exemplary embodiment of the present specification provides an organic electronic device is an organic light emitting device comprising: a first electrode; a second electrode; and an organic material layer having one or more layers disposed between the first electrode and the second electrode, wherein one or more layers of the organic material layer include the polymer.

In an exemplary embodiment of the present specification, the organic material layer includes a light emitting layer, and the light emitting layer includes the polymer.

In an exemplary embodiment of the present specification, the organic material layer includes a hole injection layer or a hole transporting layer, and the hole injection layer or the hole transporting layer includes the polymer.

In another exemplary embodiment of the present specification, the organic material layer includes an electron injection layer or an electron transporting layer, and the electron injection layer or the electron transporting layer includes the polymer.

In an exemplary embodiment of the present specification, the organic electronic device may be an organic transistor.

An exemplary embodiment of the present specification provides an organic electronic device is an organic transistor comprising: a source; a drain; a gate; and an organic material layer having one or more layers, wherein one or more layers of the organic material layer include the polymer.

In an exemplary embodiment of the present specification, the organic electronic device may be an organic solar cell.

In an exemplary embodiment of the present specification, the organic electronic device is an organic solar cell including: a first electrode; a second electrode; and an organic material layer having one or more layers, which includes a photoactive layer disposed between the first electrode and the second electrode, wherein one or more layers of the organic material layer include the polymer.

According to the principle of the organic solar cell, a p-type semiconductor forms an exciton in which an electron and a hole form a pair by light excitation, and the exciton is dissociated into an electron and a hole in a p-n junction portion. The dissociated electron and hole are transferred to an n-type semiconductor thin film and a p-type semiconductor thin film, respectively, and the electron and hole are collected in the first electrode and the second electrode, respectively, and thus may be externally used as electric energy.

FIG. 1 is a view illustrating an organic solar cell according to an exemplary embodiment of the present specification. FIG. 1 includes a substrate 101, a first electrode 102, a hole transporting layer 103, a photoactive layer 104, and a second electrode 105.

However, the organic solar cell according to an exemplary embodiment of the present specification is not limited to the structure and material in FIG. 1, an additional layer may be disposed, and each layer may be constituted by using various materials.

In another exemplary embodiment, the organic solar cell may further include an additional organic material layer. The organic solar cell may reduce the number of organic material layers by using an organic material which simultaneously has various functions.

In an exemplary embodiment of the present specification, the organic material layer includes a photoactive layer and an organic material layer disposed between the photoactive layer and the first electrode or the second electrode, and the organic material layer disposed between the photoactive layer and the first electrode or the second electrode includes the polymer.

In an exemplary embodiment of the present specification, the organic material layer includes a photoactive layer, the photoactive layer has a bilayer thin film structure including an n-type organic material layer and a p-type organic material layer, and the p-type organic material layer includes the polymer.

In an exemplary embodiment of the present specification, the organic material layer includes a photoactive layer, the photoactive layer has a bulk heterojunction structure including an electron donor material and an electron acceptor material, and the electron donor material includes the polymer.

The bulk heterojunction means that an electron donor material and an electron acceptor material are mixed with each other in a photoactive layer.

The bulk heterojunction in which the electron donor material and the electron acceptor material are mixed with each other may be present as largely an electron donor-rich part, an electron acceptor-rich part, and a part in which the electron donor and the electron acceptor co-exist (mixed phase). The exciton formed in the photoactive layer is dissociated into holes and electrons in the part in which the electron donor and the electron acceptor co-exist and the part in which the electron donor and the electron acceptor are brought into contact with each other, and holes and electrons each are transferred to a first electrode or a second electrode along the molecules of the electron acceptor material and the electron donor material.

In the polymer according to an exemplary embodiment of the present specification, the main chain is composed of an electron-donating unit (push), and the side chain is composed of an electron-withdrawing unit (pull), so that it is possible to expect to minimize the recombination of electrons and holes, and to increase the efficiency of the device due to an increase in dielectric constant caused by the localization of charges in the molecule.

Further, in the polymer, which acts as an electron donor material in the photoactive layer, the side chain is composed of the electron-withdrawing unit to be easily brought into contact with the electron acceptor material, so that electrons are easily transferred to the electron acceptor material.

In an exemplary embodiment of the present specification, an organic compound included in the electron acceptor material is one or two or more compounds selected from the group consisting of fullerene, fullerene derivatives ((6,6)-phenyl-C61-butyric acid-methylester (PCBM) or (6,6)-phenyl-C61-butyric acid-cholesteryl ester (PCBCR)), perylene, polybenzimidazole (PBI), and 3,4,9,10-perylene-tetracarboxylic bis-benzimidazole (PTCBI).

The organic solar cell according to an exemplary embodiment of the present specification includes a first electrode, a photoactive layer, and a second electrode. The organic solar cell may further include a substrate, a hole transporting layer, and/or an electron transporting layer.

In an exemplary embodiment of the present specification, the first electrode is an anode, and the second electrode is a cathode. In another exemplary embodiment, the first electrode is a cathode, and the second electrode is an anode.

In an exemplary embodiment of the present specification, in the organic solar cell, a cathode, a photoactive layer, and an anode may be arranged in this order, and an anode, a photoactive layer, and a cathode may be arranged in this order, but the arrangement order is not limited thereto.

In an exemplary embodiment of the present specification, the organic electronic device has a normal structure. The normal structure may mean that an anode is formed on a substrate. Specifically, according to an exemplary embodiment of the present specification, when the organic electronic device has a normal structure, a first electrode to be formed on a substrate may be an anode.

In an exemplary embodiment of the present specification, the organic electronic device has an inverted structure. The inverted structure may mean that a cathode is formed on a substrate. Specifically, according to an exemplary embodiment of the present specification, when the organic electronic device has an inverted structure, a first electrode to be formed on a substrate may be a cathode.

In an exemplary embodiment of the present specification, the organic solar cell has a normal structure, the organic material layer includes: a photoactive layer; and an organic material layer disposed between the photoactive layer and the second electrode, the organic material layer disposed between the photoactive layer and the second electrode includes the polymer, the first electrode is an anode electrode, and the second electrode is a cathode electrode.

In an exemplary embodiment of the present specification, the organic electronic device has an inverted structure, the organic material layer includes an organic material layer disposed between the photoactive layer and the first electrode, the organic material layer disposed between the photoactive layer and the first electrode includes the polymer, the first electrode is a cathode electrode, and the second electrode is an anode electrode.

In an exemplary embodiment of the present specification, the organic electronic device may further include an additional organic material layer. Further, the organic electronic device may reduce the number of organic material layers by using an organic material which simultaneously has various functions.

In the present specification, the substrate may be a glass substrate or a transparent plastic substrate having excellent transparency, surface smoothness, ease of handling, and waterproofing properties, but is not limited thereto, and the substrate is not limited as long as the substrate is a substrate typically used for the organic solar cell. Specific examples thereof include glass or polyethylene terephthalate (PET), polyethylene naphthalate (PEN), polypropylene (PP), polyimide (PI), triacetyl cellulose (TAC), and the like, but are not limited thereto.

The anode electrode may be made of a material which is transparent and has excellent conductivity, but is not limited thereto. Examples thereof include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as $ZnO:Al$ or $SnO_2:Sb$; a conductive polymer such as poly(3-methylthiophene), poly[3,4-(ethylene-1,2-dioxy)thiophene] (PEDOT), polypyrrole, and polyaniline; and the like, but are not limited thereto.

A method of forming the anode electrode is not particularly limited, but the anode electrode may be formed, for example, by being applied onto one surface of a substrate using sputtering, e-beam, thermal deposition, spin coating, screen printing, inkjet printing, doctor blade, or a gravure printing method, or by being coated in the form of a film.

When the anode electrode is formed on a substrate, the anode electrode may be subjected to processes of cleaning, removing moisture, and hydrophilic modification.

For example, a patterned ITO substrate is sequentially cleaned with a cleaning agent, acetone, and isopropyl alcohol (IPA), and then dried on a hot plate at 100 to 150° C. for 1 to 30 minutes, preferably at 120° C. for 10 minutes in order to remove moisture, and when the substrate is completely cleaned, the surface of the substrate is hydrophilically modified.

Through the surface modification as described above, the junction surface potential may be maintained at a level suitable for a surface potential of a photoactive layer. Further, during the modification, a polymer thin film may be easily formed on an anode electrode, and the quality of the thin film may also be improved.

Examples of a pre-treatment technology for an anode electrode include a) a surface oxidation method using a parallel plate-type discharge, b) a method of oxidizing a surface through ozone produced by using UV (ultraviolet) rays in a vacuum state, c) an oxidation method using oxygen radicals produced by plasma, and the like.

One of the methods may be selected depending on the state of an anode electrode or a substrate. However, even though any method is used, commonly, it is preferred to prevent oxygen from leaving from the surface of the anode electrode or the substrate, and maximally suppress moisture and organic materials from remaining. In this case, it is possible to maximize a substantial effect of the pre-treatment.

As a specific example, it is possible to use a method of oxidizing a surface through ozone produced by using UV. In this case, a patterned ITO substrate after being ultrasonically cleaned is baked on a hot plate and dried well, and then introduced into a chamber, and the patterned ITO substrate may be cleaned by ozone generated by reacting an oxygen gas with UV light by operating a UV lamp.

However, the surface modification method of the patterned ITO substrate in the present specification need not be particularly limited, and any method may be used as long as the method is a method of oxidizing a substrate.

The cathode electrode may be a metal having a low work function, but is not limited thereto. Specific examples thereof include: a metal such as magnesium, calcium, sodium, potassium, titanium, indium, yttrium, lithium, gadolinium, aluminum, silver, tin, and lead, or an alloy thereof; and a multi-layer structured material such as LiF/Al, $LiO_2$/Al, LiF/Fe, Al:Li, Al:$BaF_2$, and Al:$BaF_2$:Ba, but are not limited thereto.

The cathode electrode may be deposited and formed in a thermal deposition machine showing a vacuum degree of $5\times10^{-7}$ torr or less, but the forming method is not limited only to this method.

The hole transporting layer and/or electron transporting layer materials serve to efficiently transfer electrons and holes separated from a photoactive layer to an electrode, and the materials are not particularly limited.

The hole transporting layer material may be poly(3,4-ethylenedioxythiophene) doped with poly(styrenesulfonic acid (PEDOT:PSS), molybdenum oxide ($MoO_x$); vanadium oxide ($V_2O_5$); nickel oxide (NiO); and tungsten oxide ($WO_x$), and the like, but is not limited thereto.

The electron transporting layer material may be electron-extracting metal oxides, and specific examples thereof include: a metal complex of 8-hydroxyquinoline; a complex including $Alq_3$; a metal complex including Liq; LiF; Ca; titanium oxide ($TiO_x$); zinc oxide (ZnO); and cesium carbonate ($Cs_2CO_3$), and the like, but are not limited thereto.

The photoactive layer may be formed by dissolving a photoactive material, such as an electron donor and/or an electron acceptor, in an organic solvent, and then applying the solution by a method such as spin coating, dip coating, screen printing, spray coating, doctor blade, and brush painting, but the forming method is not limited thereto.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Preparation Example 1. Preparation of Chemical Formula 1-C
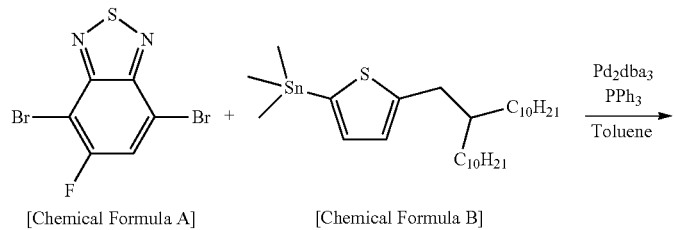
[Chemical Formula A]   [Chemical Formula B]
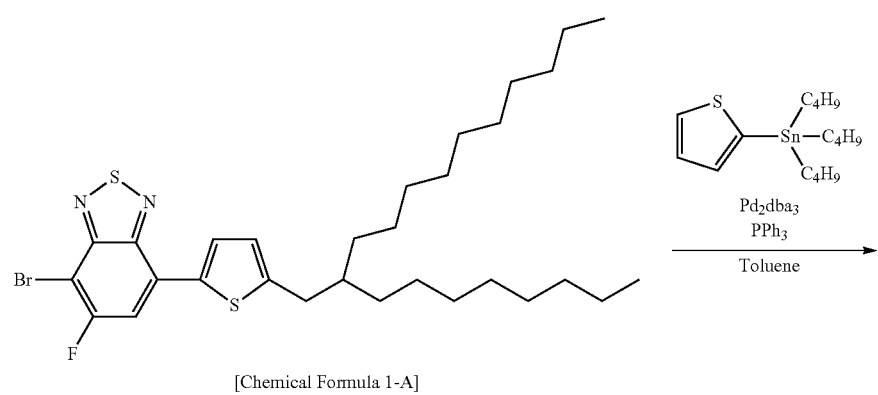
[Chemical Formula 1-A]
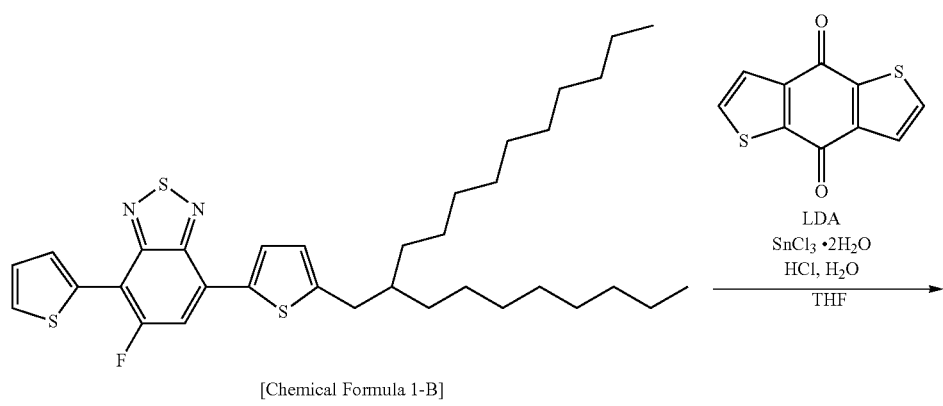
[Chemical Formula 1-B]

-continued

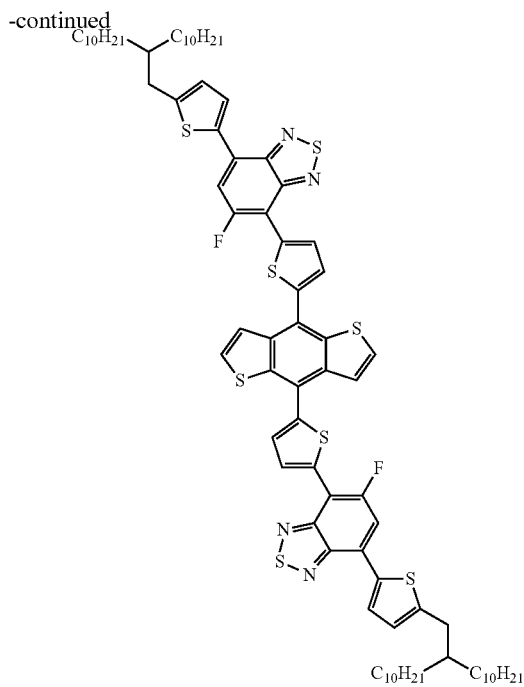

[Chemical Formula C]

(1) Preparation of Chemical Formula 1-A

Chemical Formula A (9.36 g, 30 mmol) and Chemical Formula B (15.83 g, 30 mmol) were dissolved in 400 ml of toluene, a tris(dibenzylideneacetone)dipalladium (0) ($Pd_2dba_3$) catalyst (1.1 g, 1.2 mmol) and a triphenylphosphine ($PPh_3$) ligand (1.26 g, 4.8 mmol) were added thereto, and the resulting mixture was stirred at 80° C. for 72 hours. After reaction, an extraction was performed with dichloromethane (DCM), and then the remaining water was removed by magnesium sulfate ($MgSO_4$), and then the solvent was removed under reduced pressure. A green-yellowish oil (76%) was obtained by subjecting the remaining product to silica column (eluent: hexane).

FIG. 2 is a view illustrating an MS spectrum of Chemical Formula 1-A.

(2) Preparation of Chemical Formula 1-B

A compound (4.23 g, 7.1 mmol) of Chemical Formula 1-A and tributyltin thiophene (2.69 g, 7.2 mmol) were dissolved in 60 ml of toluene, a tris(dibenzylideneacetone) dipalladium (0) ($Pd_2dba_3$) catalyst (0.23 g, 0.25 mmol) and a triphenylphosphine ($PPh_3$) ligand (0.26 g, 1 mmol) were added thereto, and the resulting mixture was stirred at 110° C. for 48 hours. After reaction, an extraction was performed with dichloromethane (DCM), and then the remaining water was removed by magnesium sulfate ($MgSO_4$), and then the solvent was removed under reduced pressure. A red oil was obtained by subjecting the remaining product to silica column (eluent: hexane). (98%)

FIG. 3 is a view illustrating an MS spectrum of Chemical Formula 1-B.

FIG. 4 is a view illustrating NMR data of Chemical Formula 1-B.

(3) Preparation of Chemical Formula 1-C

After a compound (1.2 g, 2 mmol) of Chemical Formula 1-B was dissolved in 20 ml of tetrahydrofuran (THF), 2.0 M lithium diisopropylamide (1.1 ml, 2.2 mmol) was slowly injected thereinto at −78° C., and then the resulting mixture was stirred at 78° C. for 1 hour, and then benzo[1,2-b:4,5-b']dithiophene-4,8-dione was added thereto while increasing the temperature to room temperature, and the resulting mixture was stirred at 50° C. for 2 hours. Thereafter, the temperature was lowered to room temperature, and then $SnCl.2H_2O$ in 1.67 ml 10% HCl was slowly added thereto.

Thereafter, the resulting mixture was further stirred for 2 hours, the solution was extracted with dichloromethane (DCM), the remaining water was removed by magnesium sulfate ($MgSO_4$), and then the solvent was removed under reduced pressure. A black-reddish solid was obtained by subjecting the remaining product to silica column (eluent: hexane) (25%).

FIG. 5 is a view illustrating an MS spectrum of Chemical Formula 1-C.

FIG. 6 is a view illustrating NMR data of Chemical Formula 1-C

Preparation Example 2. Preparation of Chemical Formula 1-E

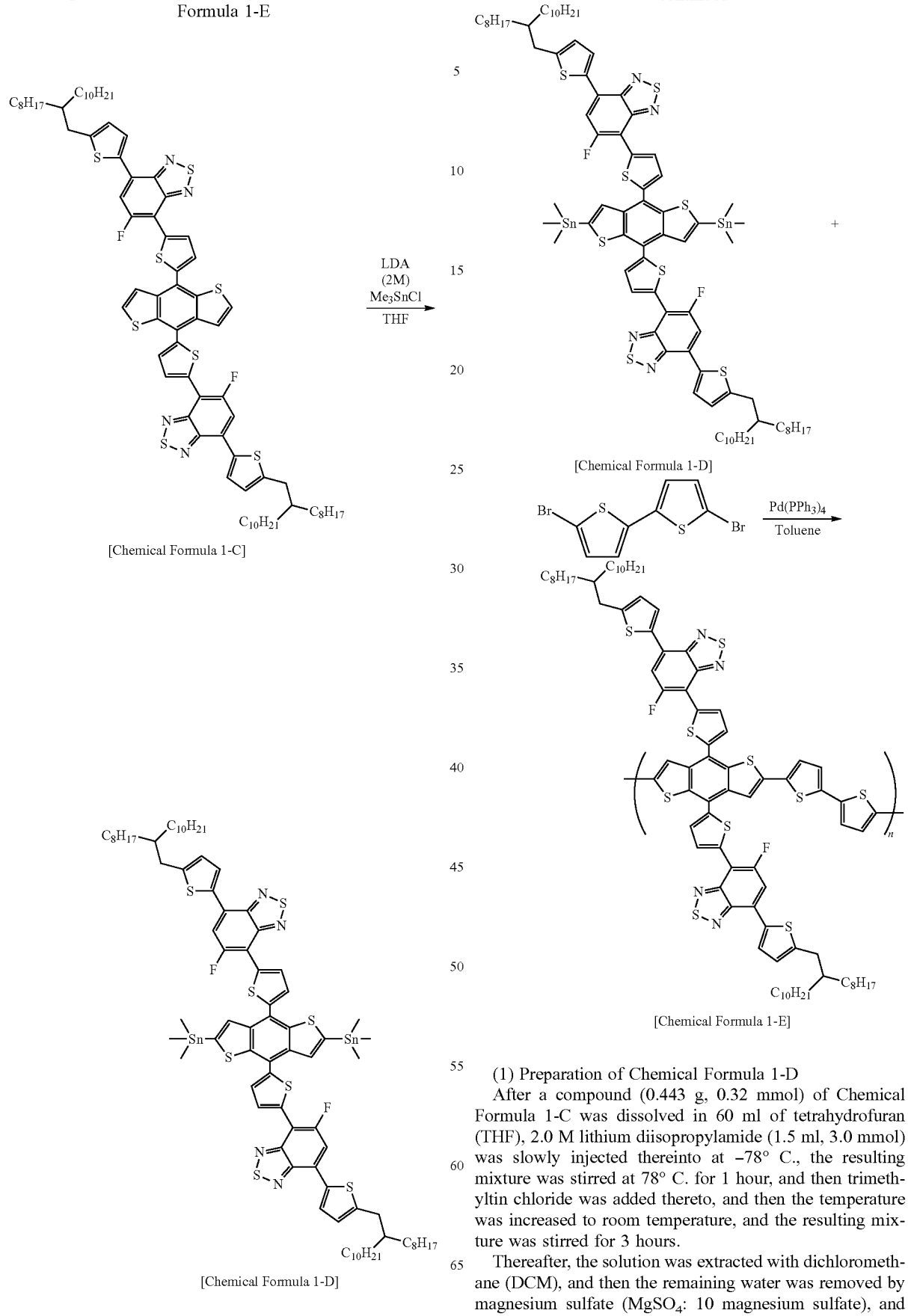

[Chemical Formula 1-C]

[Chemical Formula 1-D]

[Chemical Formula 1-D]

[Chemical Formula 1-E]

(1) Preparation of Chemical Formula 1-D

After a compound (0.443 g, 0.32 mmol) of Chemical Formula 1-C was dissolved in 60 ml of tetrahydrofuran (THF), 2.0 M lithium diisopropylamide (1.5 ml, 3.0 mmol) was slowly injected thereinto at −78° C., the resulting mixture was stirred at 78° C. for 1 hour, and then trimethyltin chloride was added thereto, and then the temperature was increased to room temperature, and the resulting mixture was stirred for 3 hours.

Thereafter, the solution was extracted with dichloromethane (DCM), and then the remaining water was removed by magnesium sulfate ($MgSO_4$: 10 magnesium sulfate), and then a black-reddish viscous liquid (1-D) was obtained by removing the solvent under reduced pressure. (83%)

FIG. 7 is a view illustrating an NMR data of Chemical Formula 1-D.

FIG. 8 is a view illustrating MS data of Chemical Formula 1-D.

(2) Preparation of Chemical Formula 1-E

Compound 1-D (0.4531 g, 0.265 mmol) and dibromobithiophene (0.0859 g, 0.265 mmol) were put into a container, and a Pd(PPh$_3$)$_4$ catalyst (0.0061 g, 0.0053 mmol) was added thereto. The mixture was degassed with nitrogen, and then 5 mL of toluene and 3 mL of dimethyl formamide (DMF) were added thereto. The mixed solution was stirred at 110° C. for 48 hours. Bromobenzotrifluoride was added to an end group, and the resulting mixture was additionally stirred at 110° C. for 4 hours.

A solid obtained by precipitating an obtained gel in methanol was dissolved in chloroform, the resulting solution was mixed with an aqueous ethylenediamine acetic acid (EDTA) solution, and the resulting mixture was stirred at 120° C. for 2 hours. A solid obtained by precipitating the reaction solution in methanol was soxhleted with methanol, acetone, hexane, petroleum ether, dichloromethane (DCM), and chloroform in this order, and final Copolymer 1-E was obtained by precipitating the portion dissolved in chloroform.

FIG. 7 is a view illustrating an NMR data of Chemical Formula 1-D.

FIG. 8 is a view illustrating MS data of Chemical Formula 1-D.

Experimental Example 1 and Comparative Example 1

Calculation of Band Gap

The highest occupied molecular orbitals (HOMOs), lowest unoccupied molecular orbitals (LUMOs), and band gaps of the following Compound A and the following Compound B were measured by using a B3PW91 functional and a 6-31G* basis set in a Gaussian 09 program.

[Compound A]

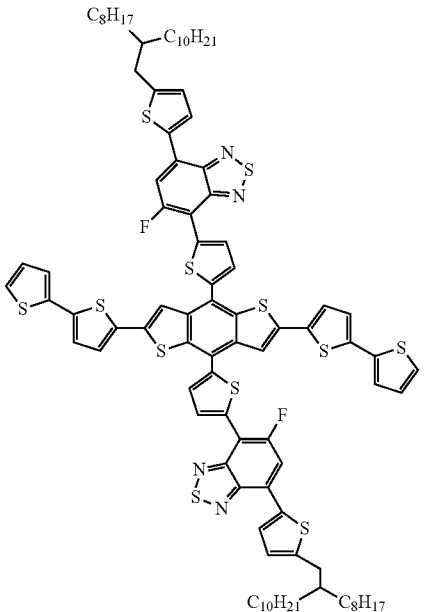

[Compound B]

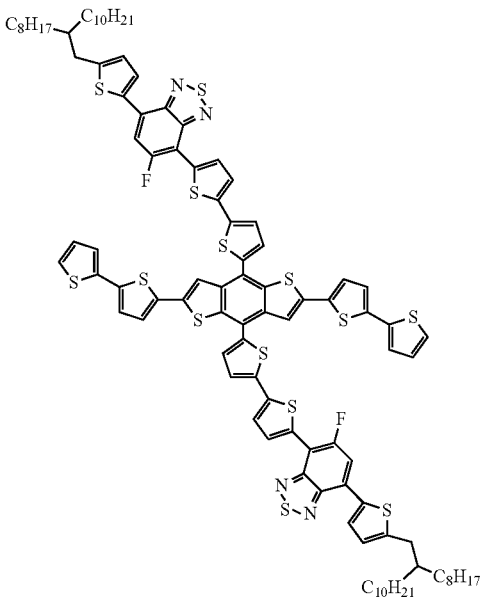

TABLE 1

|  | Experimental Example 1 | Comparative Example 1 |
| --- | --- | --- |
| Compound | Compound A | Compound B |
| HOMO | 5.31 | 5.27 |
| LUMO | 3.54 | 3.47 |
| Band gap | 1.77 | 1.80 |

As shown in Table 1, the band gap of Compound A was calculated to be smaller than that of Compound B. Through the results, it was confirmed that in Chemical Formula 2, the case where n1 is 1 had a smaller band gap than that of the case where n1 is 2 because the former had a stronger intramolecular charge transfer (ICT) between [Push] and [Pull$_1$] or [Push] and [Pull$_2$] than that of the latter.

Experimental Example 2

A composite solution was prepared by using the prepared polymer as an electron donor and PC$_{70}$BM as an electron acceptor while setting the blending ratio to 1:3 (w/w ratio), and dissolving the mixture in dichlorobenzene (DCB). In this case, the concentration was adjusted to 2.0 wt %, and an organic solar cell was made to have a structure of ITO/PEDOT:PSS/a photoactive layer/Al. A glass substrate coated with ITO was ultrasonically washed by using distilled water, acetone, and 2-propanol, and the ITO surface was treated with ozone for 10 minutes, followed by heat treatment at 235° C. for 5 minutes by spin-coating PEDOT:PSS (AI4083) to have a thickness of 45 nm at 4,000 rpm for 40 seconds. For the coating of the photoactive layer, a compound-PC$_{70}$BM composite solution was filtered with a 0.45 µm PP syringe filter and spin-coated, and then an organic solar cell was manufactured by depositing Al to have a thickness of 100 nm using a thermal evaporator under a vacuum of 3×10$^{-8}$ torr.

The photoelectric conversion characteristics of the organic solar cell manufactured in the Experimental Example were measured under the condition of 100 mW/cm$^2$, and the results are shown in the following Table 2.

TABLE 2

| | Photoactive layer | Voc (V) | Jsc (mA/cm$^2$) | FF (%) | PCE (%) |
|---|---|---|---|---|---|
| Experimental Example 2 | Chemical Formula 1-E | 0.81 | 4.42 | 45.17 | 1.61 |

In Table 2, $V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

From the results in Table 2, it was confirmed that the polymer according to an exemplary embodiment of the present specification could be used as a material for an organic solar cell.

FIG. 9 is a view illustrating the current density according to the voltage in an organic solar cell manufactured in Experimental Example 2.

The invention claimed is:
1. A polymer comprising a unit represented by the following Chemical Formula 1:

[Chemical Formula 1]

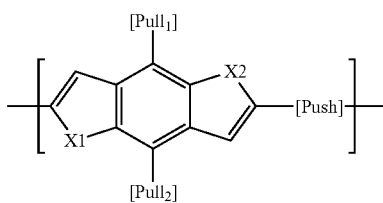

in Chemical Formula 1,
X1 and X2 are the same as or different from each other, and are each independently CRR', NR, O, SiRR', PR, S, GeRR', Se, or Te,
R and R' are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group,

[Push] is a structure in which one or two or more among the following structures are bonded,

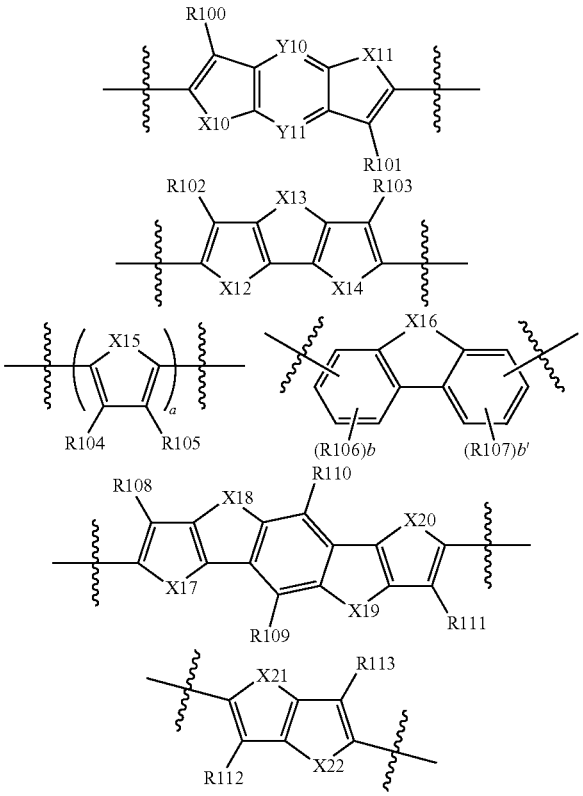

in the structures,
a is an integer from 1 to 4,
b and b' are each an integer from 1 to 3,
when a, b, and b' are each 2 or more, two or more structures in the parenthesis are the same as or different from each other,
X10 to X22 are the same as or different from each other, and are each independently CRaRb, NRa, O, SiRaRb, PRa, S, GeRaRb, Se, or Te,
Y10 and Y11 are the same as or different from each other, and are each independently CRc, N, SiRc, P, or GeRc,
Ra, Rb, Rc, and R100 to R113 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group,

[Pull₁] and [Pull₂] are a group that acts as an electron acceptor, are the same as or different from each other, and are each independently represented by the following Chemical Formula 2 or the following Chemical Formula 3,

[Chemical Formula 2]

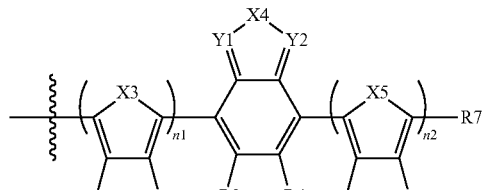

[Chemical Formula 3]

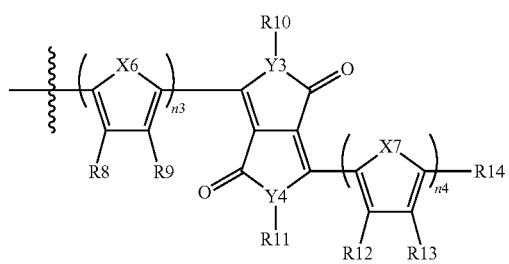

in Chemical Formulae 2 and 3,

X3 to X7 are the same as or different from each other, and are each independently CR15R16, NR15, O, SiR15R16, PR15, S, GeR15R16, Se, or Te, Y1 to Y4 are the same as or different from each other, and are each independently CR17, N, SiR17, P, or GeR17, n1 is an integer of 0 or 1, n2 to n4 are each an integer from 0 to 3, when n2 to n4 are each an integer of 2 or more, two or more structures in the parenthesis are the same as or different from each other, and R1 to R17 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group.

2. The polymer of claim 1, wherein X1 and X2 are S.

3. The polymer of claim 1, wherein the [Pull₁] and the [Pull₂] represented by Chemical Formula 2 or Chemical Formula 3 are represented by the following Chemical Formula 2-1 or Chemical Formula 3-1:

[Chemical Formula 2-1]

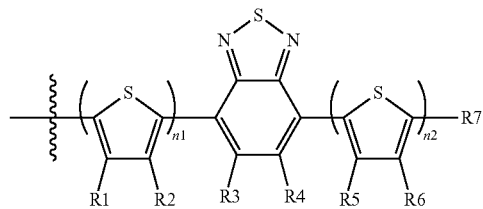

[Chemical Formula 3-1]

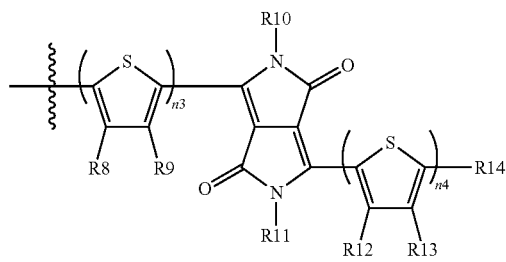

in Chemical Formulae 2-1 and 3-1, n1 to n4 and R1 to R14 are the same as those defined in Chemical Formula 2 and Chemical Formula 3.

4. The polymer of claim 1, wherein the polymer comprises a unit represented by any one of the following Chemical Formulae 1-1 to 1-4:

[Chemical Formula 1-1]

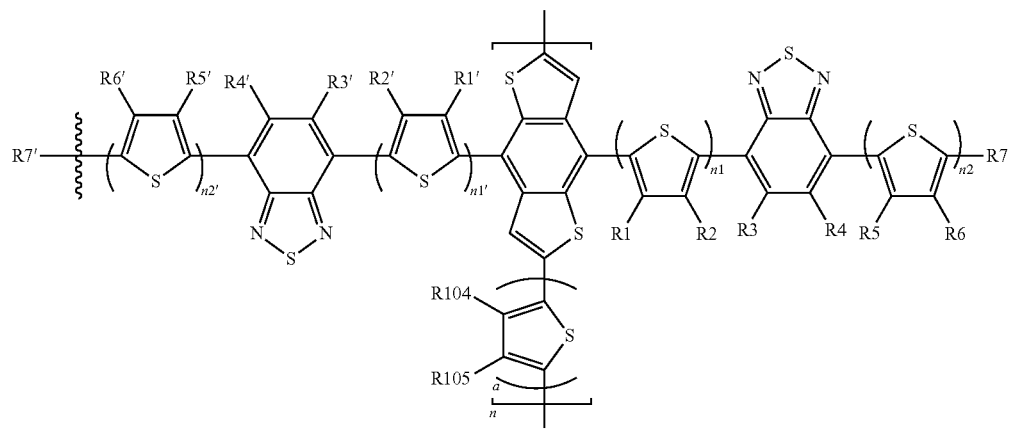

-continued

[Chemical Formula 1-2]

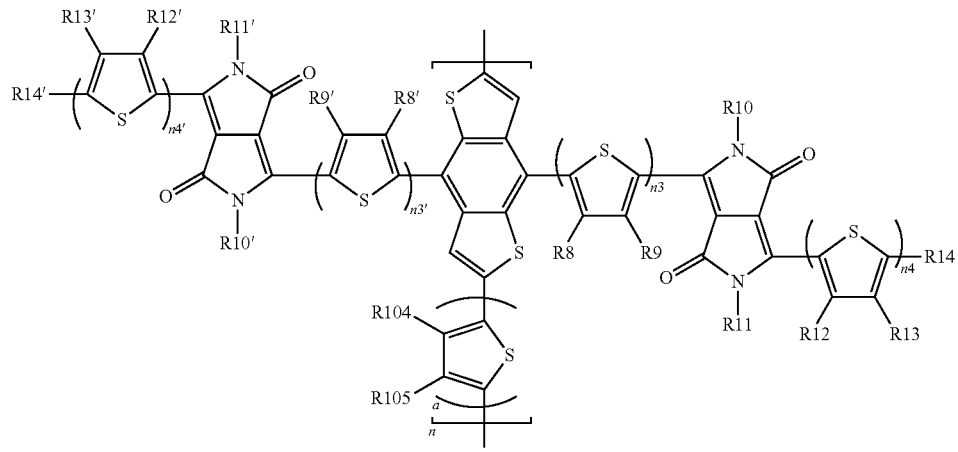

[Chemical Formula 1-3]

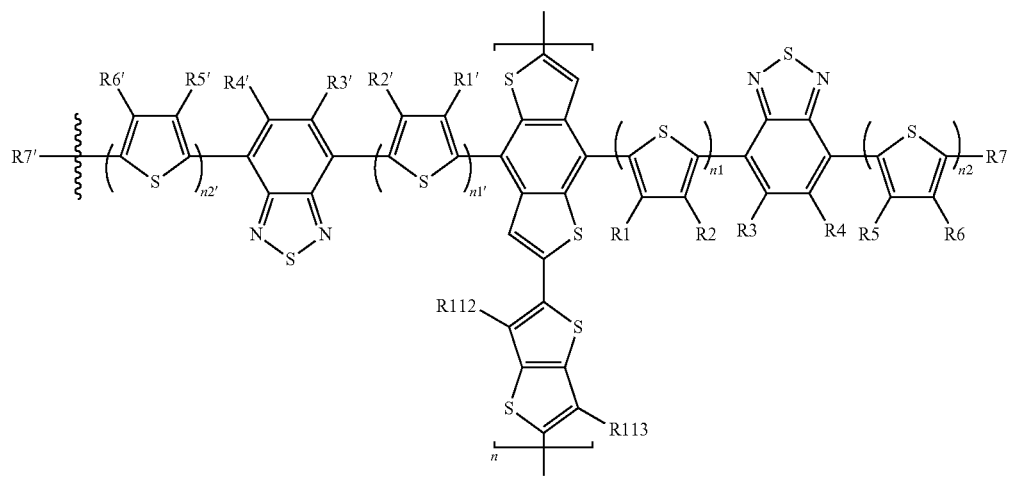

[Chemical Formula 1-4]

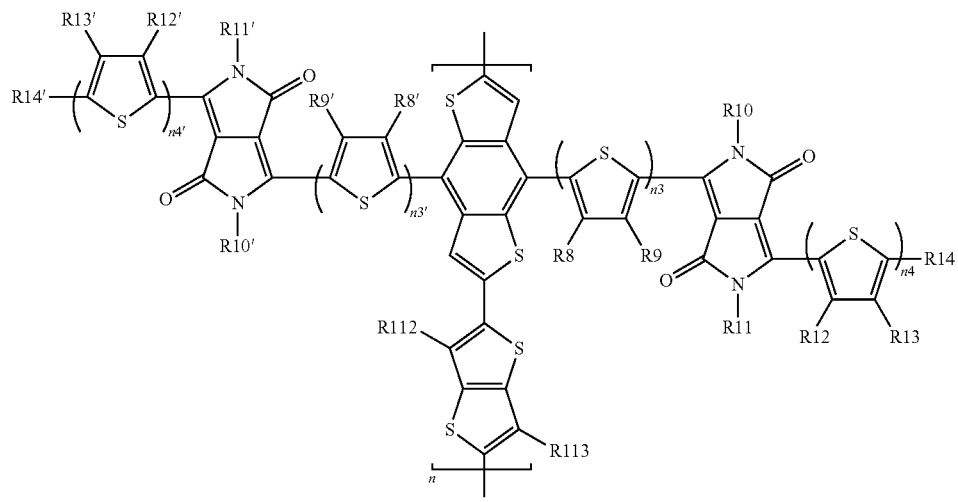

in Chemical Formulae 1-1 to 1-4,
a is an integer from 1 to 4,
n is a repeating number of the unit, and an integer from 1 to 1,000,
n1 and n1' are an integer of 0 or 1,
n2 to n4 and n2' to n4' are each an integer from 0 to 3,
when a, n2 to n4, and n2' to n4' are each an integer of 2 or more, two or more structures in the parenthesis are the same as or different from each other, and
R1 to R14, R1' to R14', R104, R105, R112, and R113 are the same as or different from each other, and are each independently hydrogen; deuterium; a halogen group; a nitrile group; a nitro group; an imide group; an amide group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted alkylamine group; a substituted or unsubstituted aralkylamine group; a substituted or unsubstituted arylamine group; a substituted or unsubstituted heteroarylamine group; a substituted or unsubstituted aryl group; or a substituted or unsubstituted heterocyclic group.

5. The polymer of claim 1, wherein the polymer has a number average molecular weight of 5,000 g/mol to 1,000,000 g/mol.

6. The polymer of claim 1, wherein the polymer has a molecular weight distribution from 1 to 10.

7. An organic electronic device comprising:
a first electrode;
a second electrode; and
an organic material layer having one or more layers disposed between the first electrode and the second electrode,
wherein one or more layers of the organic material layer comprise the polymer according to claim 1.

8. The organic electronic device of claim 7, wherein the organic electronic device is selected from the group consisting of an organic light emitting device; an organic solar cell; and an organic transistor.

9. The organic electronic device of claim 7, wherein the organic electronic device is an organic solar cell comprising: a first electrode; a second electrode; and an organic material layer having one or more layers, which comprises a photoactive layer disposed between the first electrode and the second electrode, and
one or more layers of the organic material layer comprise the polymer.

10. The organic electronic device of claim 9, wherein the photoactive layer has a bilayer thin film structure comprising an n-type organic material layer and a p-type organic material layer, and the p-type organic material layer comprises the polymer.

11. The organic electronic device of claim 9, wherein the photoactive layer has a bulk heterojunction structure comprising an electron-donating material and an electron-accepting material, and the electron-donating material comprises the polymer.

12. The organic electronic device of claim 7, wherein the organic electronic device is an organic transistor comprising: a source; a drain; a gate; and an organic material layer having one or more layers, and one or more layers of the organic material layer comprise the polymer.

* * * * *